United States Patent
Lin et al.

(10) Patent No.: US 9,257,187 B2
(45) Date of Patent: Feb. 9, 2016

(54) DATA STORING METHOD, MEMORY CONTROL CIRCUIT UNIT AND MEMORY STORAGE APPARATUS

(71) Applicant: PHISON ELECTRONICS CORP., Miaoli (TW)

(72) Inventors: Wei Lin, Taipei (TW); Kiang-Giap Lau, Hsinchu County (TW); Hoe-Hong Lim, Miaoli County (TW); Yu-Cheng Hsu, Yilan County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/285,656

(22) Filed: May 23, 2014

(65) Prior Publication Data
US 2015/0262677 A1 Sep. 17, 2015

(30) Foreign Application Priority Data

Mar. 13, 2014 (TW) .............................. 103109032 A

(51) Int. Cl.
*G11C 16/10* (2006.01)
*G11C 16/26* (2006.01)

(52) U.S. Cl.
CPC ................ *G11C 16/10* (2013.01); *G11C 16/26* (2013.01)

(58) Field of Classification Search
None
See application file for complete search history.

(56) References Cited

U.S. PATENT DOCUMENTS

2011/0219284 A1    9/2011   Uchikawa et al.
2012/0265927 A1*  10/2012   Cho ................... G11C 11/5642
                                                        711/103

OTHER PUBLICATIONS

"Office Action of Taiwan Counterpart Application," issued on Jul. 28, 2015, p. 1-p. 10.

* cited by examiner

*Primary Examiner* — James G Norman
(74) *Attorney, Agent, or Firm* — Jianq Chyun IP Office

(57) ABSTRACT

A data writing method, and a memory control circuit unit and a memory storage apparatus using the method are provided. The method including: programming data to several memory cells on a first word line of the rewritable non-volatile memory module of the memory storage apparatus, and a first predetermined reading voltage is initially configured for the first word line. The data storing method further includes: adjusting the first predetermined reading voltage to obtain a first available reading voltage for the first word line, and applying the first available reading voltage to the first word line to read first page data. The storing method further includes: if the difference value between the first available reading voltage and the first predetermined reading voltage is larger than a predetermined threshold value, performing a protection operation for the first page data.

21 Claims, 16 Drawing Sheets

| Retry read operation times | Adjustment voltage value(V) |
|---|---|
| #1 | −0.3 |
| #2 | −0.5 |
| #3 | −0.7 |
| #4 | −1 |
| #5 | −1.3 |
| #6 | +0.3 |
| #7 | +0.5 |
| #8 | +0.7 |
| #9 | +1 |
| #10 | +1.3 |

FIG. 15

DATA STORING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 103109032, filed on Mar. 13, 2014. The entirety of the above-mentioned patent application is hereby incorporated by reference herein and made a part of this specification.

BACKGROUND

1. Technology Field

The present invention relates to a data storing method. More particularly, the present invention relates to a data storing method for a rewritable non-volatile memory module, a memory control circuit unit, and a memory storage apparatus using the same.

2. Description of Related Art

Along with the widespread of digital cameras, cell phones, and MP3 in recently years, the consumers' demand for storage media has increased drastically. Since a rewritable non-volatile memory has the characteristics of non-volatility of data, low power consumption, small volume, non-mechanical structure, and fast reading and writing speed, the rewritable non-volatile memory is the most adaptable memory to be applied in a portable electronic product, e.g., a notebook computer. A solid state drive (SSD) is a storage apparatus which utilizes a flash memory as its storage medium. Therefore, the flash memory industry has become a very popular part of the electronic industry in recent years.

Additionally, a NAND flash memory may be classified into a Single Level Cell (SLC) NAND flash memory, a Multi Level Cell (MLC) NAND flash memory or a Trinary Level Cell (TLC) NAND flash memory.

However, no matter what flash memory module, when multiple reading operations are performed on the flash memory module, for example, with a hundred thousand to a million reading times, there would be a possibility that error bits occur at the read data, and more even, the data stored in a physical erasing unit, which is already read for several times, would be lost or have an abnormal states. This phenomenon is referred as the read-disturb by the person skilled in the art. Especially, the flash memory module stores the system data of the flash memory storage system (e.g., The Firmware Code, The File Allocation Table (FAT)), and the system data will be read very frequently during the operation period of the flash memory storage system.

FIG. 1 is a diagram of the flash memory unit according to the related art.

Referring to FIG. 1, a flash memory unit 1 includes a charge-trapping layer 2 for storing electrons, a control gate 3 for applying a voltage, a tunnel oxide layer 4, and an interpoly dielectric layer 5. When it is intended to write data into the flash memory unit 1, a threshold voltage of the flash memory unit 1 may be changed by injecting electrons into the charge-trapping layer 2. Accordingly, a digital-level state of the flash memory unit 1 is defined to implement a function of storing data. Here, the process of injecting the electrons to the charge-trapping layer 2 is referred to as a programming process. By contrast, when it is intended to remove the stored data, the injected electrons are removed from the charge-trapping layer 2, and thereby the flash memory unit 1 is restored back to the default state before programming.

However, during the manufacture of the flash memory unit 1, a critical voltage distribution of the flash memory unit 1 may shift due to the variation of the manufacturing process such that the storage state of the flash memory unit 1 cannot be determined correctly, and the foregoing read-disturb phenomenon will happened. In the present flash memory, because the electric field for crossing the tunnel oxide is raised with the microminiaturization of the process of the flash memory, the read-disturb of the flash memory becomes more serious. So that, it drives every manufacturer to develop a mechanism which may ensure that data will be stored correctly.

And, the present mechanism for read-disturb protection is to set an error bit number threshold value during the reading operation, and rewrite the data having the error bits, which is more than the error bit number threshold value, into the other physical erasing unit to ensure the accuracy of the data. However, there are many reasons for occurring error bits. When taking the error bits number as the criterion, it would cause that the rewriting of the flash memory is too often to decrease the life of the rewritable non-volatile memory storage apparatus.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to a data storing method, memory storage apparatus and memory control circuit unit using the same, which can effectively prevent data from losing because of the read-disturb, and extend the lifespan of the memory storage apparatus.

According to an exemplary embodiment of the present invention, a data storing method for a rewritable non-volatile memory module is provided, wherein the rewritable non-volatile memory module has several memory cells, several word lines and several bit lines. Each of the memory cells electrically connects with one of the word lines and one of the bit lines. Moreover, each of the memory cells stores several bit data, and each of the bit data may be identified as a first state or a second state. And, the data storing method includes: programming data into several memory cells connecting to a first word line among the word lines, wherein a first predetermined reading voltage is initially configured for the first word line; adjusting the first predetermined reading voltage to obtain a first available reading voltage for the first word line and applying the first available reading voltage to the first word line to read first page data, wherein the first page data may be corrected by an error checking and correcting circuit correctly. And, the foregoing data storing method further includes: when a first difference value between the first available reading voltage and the first predetermined reading voltage is larger than a first predetermined threshold value, programming the first page data into several memory cells connecting to a second word line among the word lines.

According to an exemplary embodiment of the present invention, a memory control circuit unit for accessing a rewritable non-volatile memory module is provided, and the memory control circuit unit includes a host interface, a memory interface and a memory management circuit. The host interface is coupled to a host system. The memory interface is coupled to the rewritable non-volatile memory module, wherein the rewritable non-volatile memory module has several memory cells, several word lines and several bit lines. Each of the memory cells electrically connects with one of the word lines and one of the bit lines. Moreover, each of the memory cells stores several bit data, and each of the bit data may be identified as a first state or a second state. The memory management circuit is coupled to the host interface and the memory interface, and is configured to give a first command sequence to the rewritable non-volatile memory module to program data into several memory cells connecting to a first word line among the word lines. And, a first predetermined reading voltage is initially configured for the first word line, and the memory management circuit is further configured to adjust the first predetermined reading voltage to obtain a first available reading voltage for the first word line and give a second command sequence to the rewritable non-volatile memory module to apply the first available reading voltage to the first word line to read first page data, wherein the first page data may be corrected by an error checking and correcting circuit correctly. When a first difference value between the first available reading voltage and the first predetermined reading voltage is larger than a first predetermined threshold value, the memory management circuit is further configured to give a third command sequence to the rewritable non-volatile memory module to program the first page data into several memory cells connecting to a second word line among the word lines.

According to an exemplary embodiment of the present invention, a memory storage device is provided, including: a connection interface unit, a rewritable non-volatile memory module and a memory control circuit unit. The connection interface unit is configured to couple to a host system. The rewritable non-volatile memory module has several memory cells, several word lines and several bit lines, and each of the memory cells electrically connects to one of the word lines and one of the bit lines. Moreover, each of the memory cells stores several bit data, and each of the bit data may be identified as a first state or a second state. The memory control circuit unit is coupled to the connection interface unit and the rewritable non-volatile memory module, and is configured to program data into several memory cells connecting to a first word line among the word lines. A first predetermined reading voltage is initially configured for the first word line, and the memory control circuit unit is further configured to adjust the first predetermined reading voltage to obtain a first available reading voltage for the first word line and apply the first available reading voltage to the first word line to read first page data, wherein the first page data may be corrected by an error checking and correcting circuit correctly. When a first difference value between the first available reading voltage and the first predetermined reading voltage is larger than a first predetermined threshold value, the memory control circuit unit is further configured to program the first page data into several memory cells connecting to a second word line of the word lines.

Accordingly, the present invention may decrease the number of times of performing read protection operation to decrease the wear of the rewritable non-volatile memory module such that the lifespan of the rewritable non-volatile memory module may be prolonged.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 15 is a diagram illustrating a retry table according to an exemplary embodiment.

DESCRIPTION OF THE EMBODIMENTS

Figure 1:
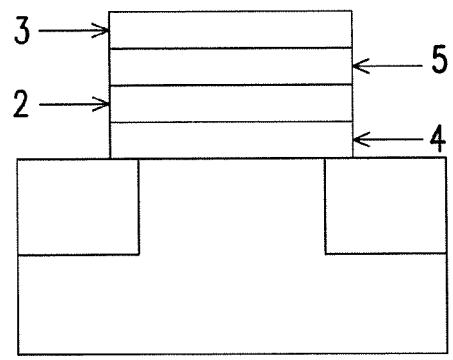
FIG. 1 is a diagram of the flash memory unit according to the related art.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage apparatus (i.e., a memory storage system), typically, includes a rewritable non-volatile memory module and a controller (i.e., a control circuit). The memory storage apparatus is usually used together with a host system, such that the host system can write data into or read data from the memory storage apparatus.

Figure 2:
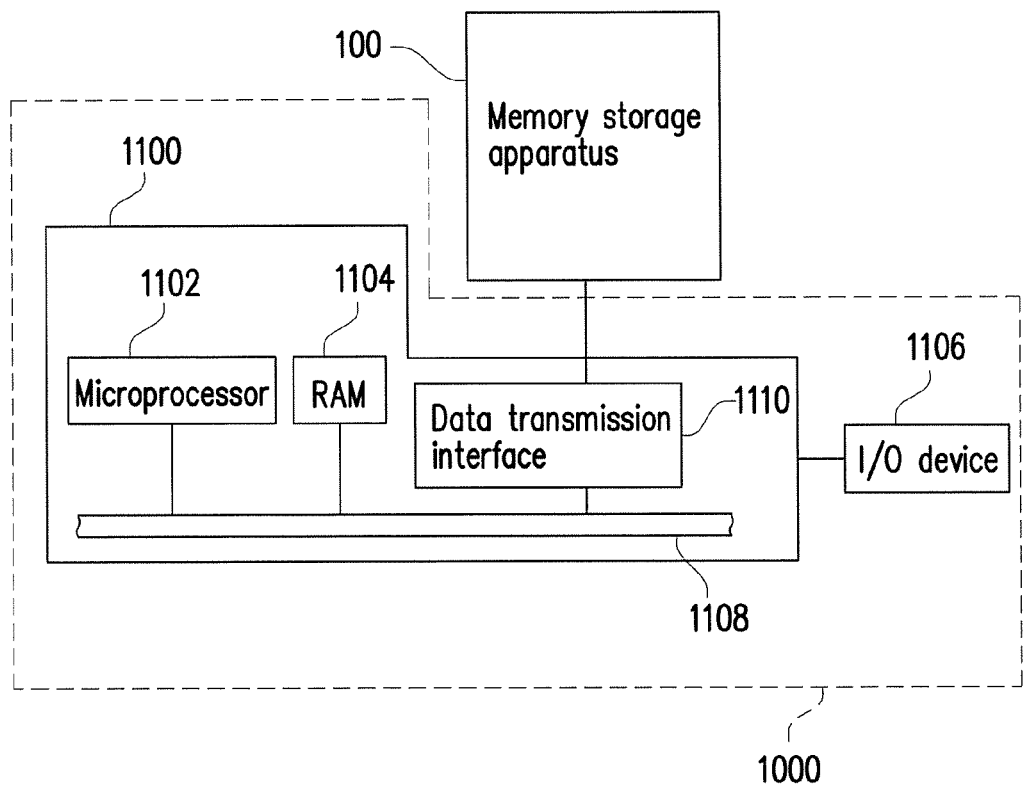
FIG. 2 illustrates a host system and a memory storage apparatus according to an exemplary embodiment.

FIG. 2 illustrates a host system and a memory storage apparatus according to an exemplary embodiment.

Figure 3:
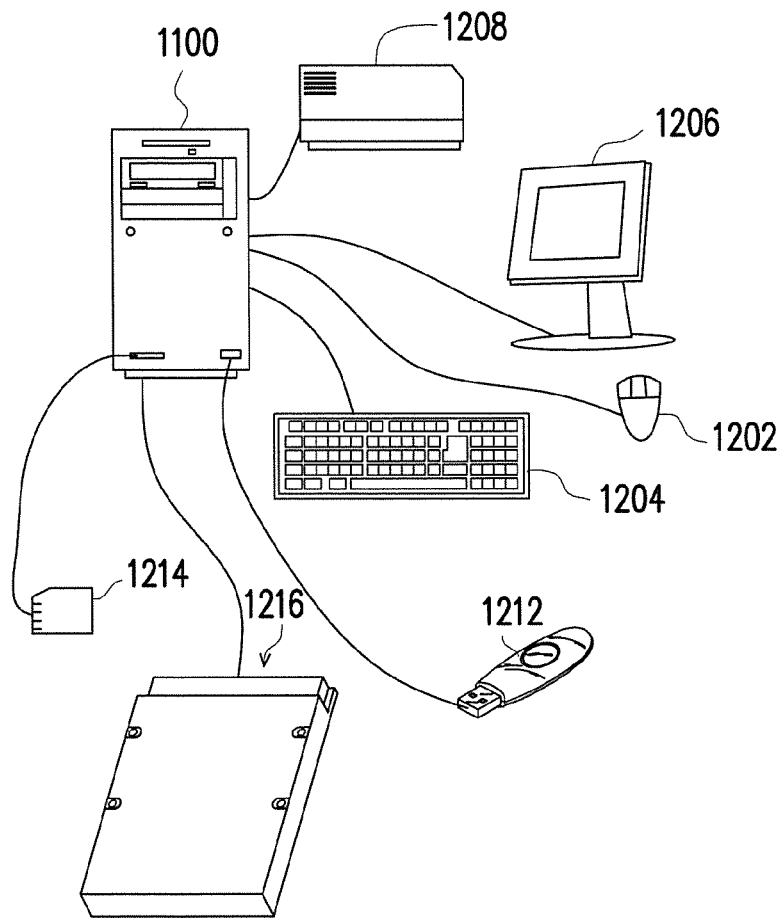
FIG. 3 schematically illustrates a computer, an input/output (I/O) device, and a memory storage apparatus according to an exemplary embodiment.

With reference to FIG. 2, a host system 1000 in most cases includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 3. It should be understood, the devices depicted in FIG. 3 should not be construed as limitations to the present disclosure, and the I/O device 1106 may include other devices as well.

In the exemplary embodiment of the present invention, the memory storage apparatus 100 is coupled to other devices of the host system 1000 through the data transmission interface 1110. By using the microprocessor 1102, the random access memory (RAM) 1104 and the Input/Output (I/O) device 1106, the data can be write into the memory storage apparatus 100 or can be read from the memory storage apparatus 100. For instance, the memory storage apparatus 100 may be a non-volatile memory storage apparatus, such as a flash drive 1212, a memory card 1214, or a solid state drive (SSD) 1216 as shown in FIG. 3.

Figure 4:
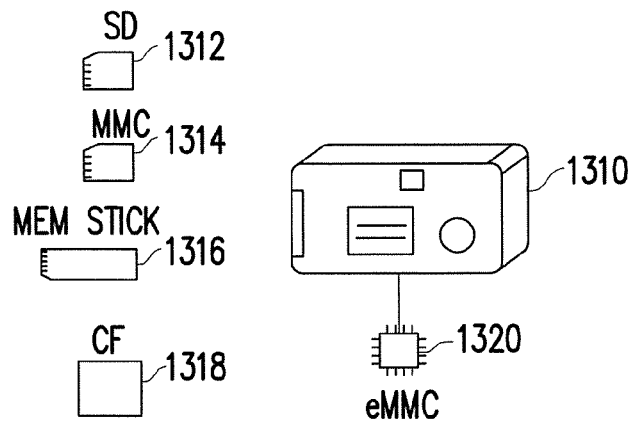
FIG. 4 schematically illustrates a host system and a memory storage apparatus according to an exemplary embodiment.

Generally, the host system 1000 can substantially be any system used together with the memory storage apparatus 100 for storing data. Even though the host system 1000 is described as a computer system in the present exemplary embodiment, the host system 1000 in another exemplary embodiment may be a digital camera, a video camera, a communication device, an audio player, a video player, and so on. For instance, if the host system is a digital camera (video camera) 1310, the rewritable non-volatile memory storage apparatus is an SD card 1312, an MMC card 1314, a memory stick 1316, a CF card 1318n or an embedded storage apparatus 1320 (as shown in FIG. 4). The embedded storage device 1320 includes an embedded MMC (eMMC). It should be noted that the eMMC is directly coupled to a substrate of the host system.

Figure 5:
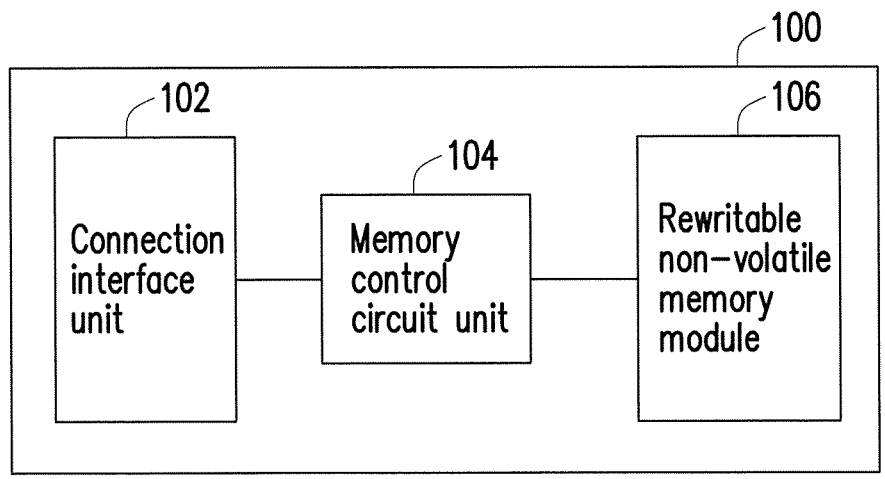
FIG. 5 is a schematic block diagram illustrating a memory storage apparatus according to an exemplary embodiment.

FIG. 5 is a schematic block diagram illustrating a memory storage apparatus according to an exemplary embodiment.

Please refer to FIG. 5, the memory storage apparatus 100 includes a connection interface unit 102, a memory control circuit unit 104, and a rewritable non-volatile memory module 106.

In the exemplary embodiment, the connection interface unit 102 complies with the Universal Serial Bus (USB) standard. However, the invention is not limited thereto, and the connection interface unit 102 may also comply with the parallel advanced technology attachment (PATA) standard, the Institute of Electrical and Electronic Engineers (IEEE) 1394 standard, the peripheral component interconnect (PCI) express standard, the secure digital (SD) standard, the Serial Advanced Technology Attachment (SATA) standard, the Ultra High Speed-I (UHS-I) standard, the Ultra High Speed-II (UHS-II) standard, the memory stick (MS) standard, the multi media card (MMC) standard, the Embedded Multimedia Card (eMMC) standard, the Universal Flash Storage (UFS) standard, the compact flash (CF) standard, the integrated device electronics (IDE) standard, or other suitable standards.

The memory control circuit unit 104 is configured to execute a plurality of logic gates or control commands which are implemented in a hardware form or in a firmware form and performing the operations such as data writing, reading or erasing in the rewritable non-volatile memory module 106 according to the command of the host system 1000.

The rewritable non-volatile memory module 106 is coupled to the memory control circuit unit 104 and is configured to store the data written by the host system 1000. In the exemplary embodiment, the rewritable non-volatile memory module 106 is a multi level cell (MLC) NAND flash memory module (Namely, a flash memory module with memory cells which may store two bits of data). However, the present invention is not limited thereto, the rewritable non-volatile memory module also may be a single level cell(SLC) NAND flash memory module (Namely, a flash memory module with memory cells which may store one bits of data), trinary level cell(TLC) NAND flash memory module (Namely, a flash memory module with memory cells which may store three bits of data), other flash memory module or other memory modules with the same feature.

Figure 6:
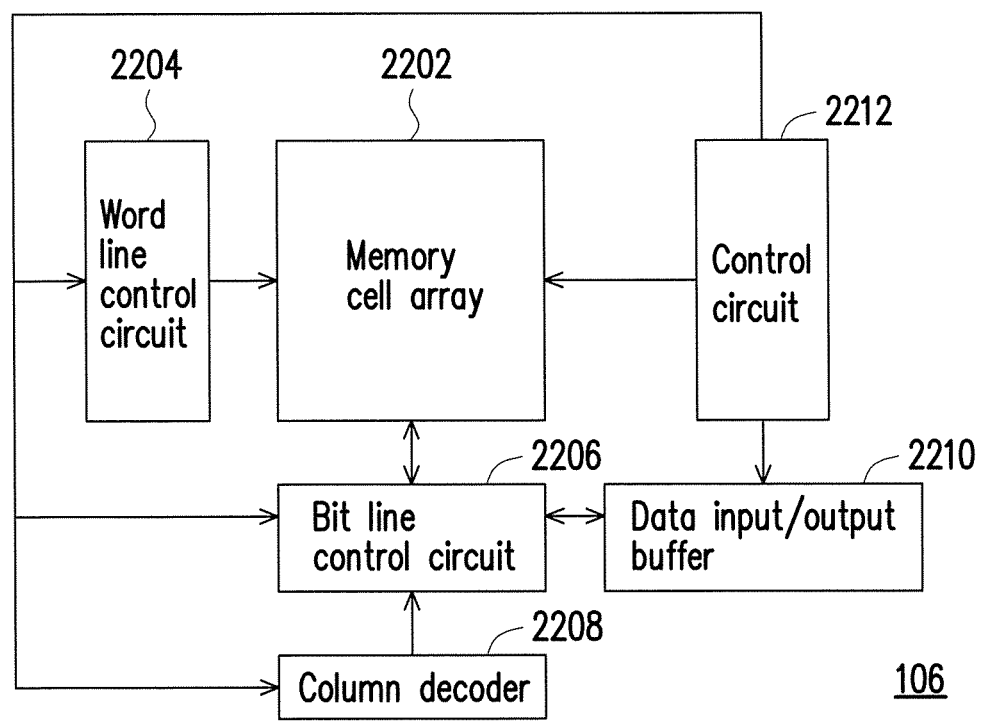
FIG. 6 is a schematic block diagram of a rewritable non-volatile memory module according to an exemplary embodiment.

FIG. 6 is a schematic block diagram of a rewritable non-volatile memory module according to an exemplary embodiment.

Please refer to FIG. 6, the rewritable non-volatile memory module 106 includes a memory cell array 2202, a word line control circuit 2204, a bit line control circuit 2206, a column decoder 2208, a data input/output (I/O) buffer 2210, and a control circuit 2212.

Figure 7:
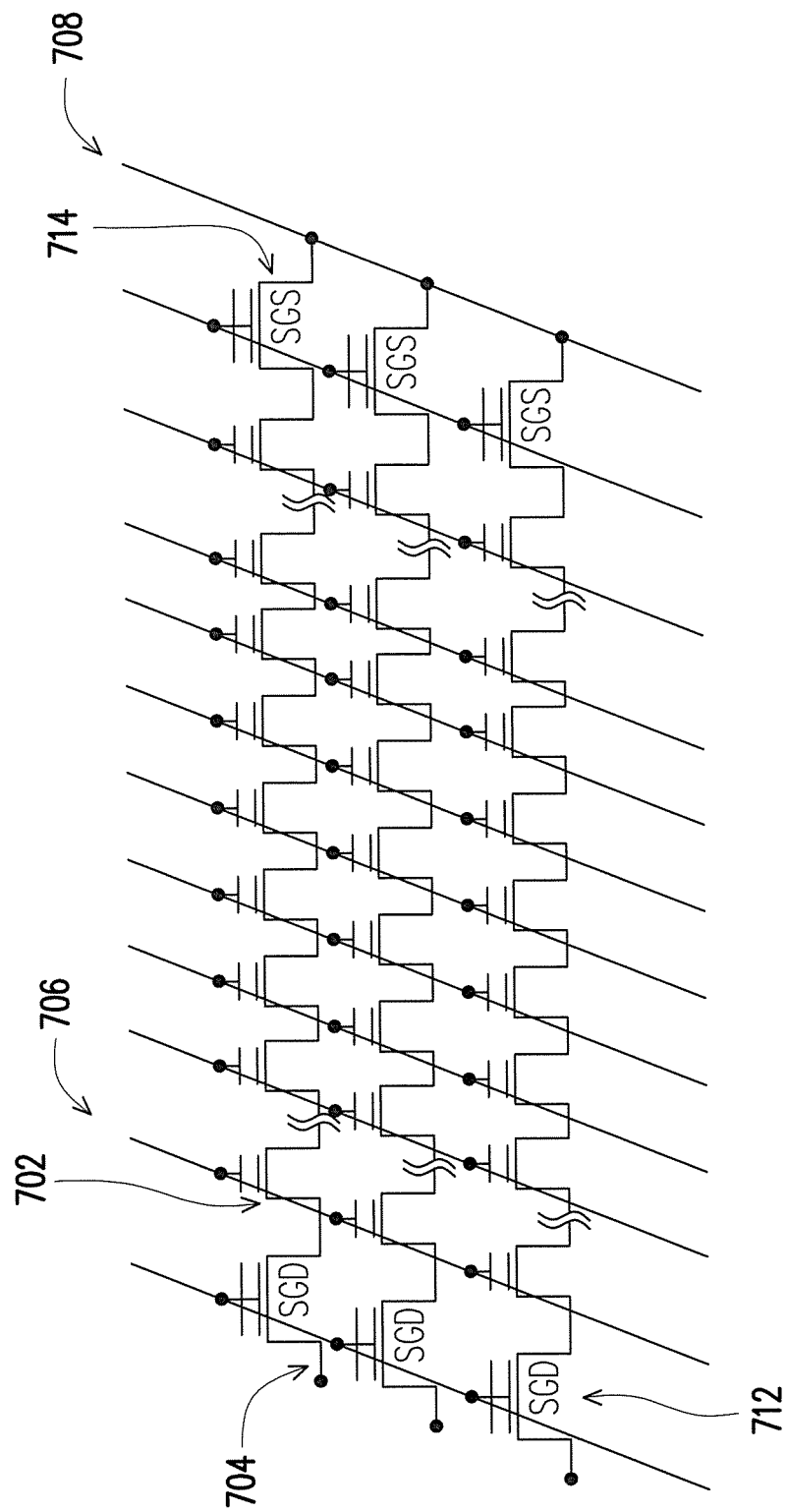
FIG. 7 is a diagram illustrating a memory cell array according to an exemplary embodiment.

FIG. 7 is a diagram illustrating a memory cell array according to an exemplary embodiment of the invention.

Please refer to FIG. 6 and FIG. 7, the memory cell array 2202 includes a plurality of memory cells for storing data, a plurality of select gate drain (SGD) transistor 712 and, a plurality of select gate source (SGS) transistor 714, and a plurality of bit lines 704, a plurality of word lines 706, and a common source line 708 (as shown in FIG. 7) which are connected to the memory cells. The memory cells 702 are disposed on the cross points of the bit lines 704 and the word lines 706 as an array. When a write command or a read command is received from the memory control circuit unit 104, the control circuit 2212 controls the word line control circuit 2204, the bit line control circuit 2206, the column decoder 2208, and the data I/O buffer 2210 to write data into the memory cell array 2202 or read data from the memory cell array 2202, wherein the word line control circuit 2204 controls the word line voltages applied to the word lines, the bit line control circuit 2206 controls the bit lines, the column decoder 2208 selects the corresponding bit line according to the decoding column address in the command, and the data I/O buffer 2210 stores the data temporarily.

The memory cells in the rewritable non-volatile memory module 106 use a plurality of gate voltages for representing a multi-bit data. To be specific, each memory cell of the memory cell array 2202 has a plurality of states, and the states are distinguished by a plurality of reading voltages.

Figure 8:
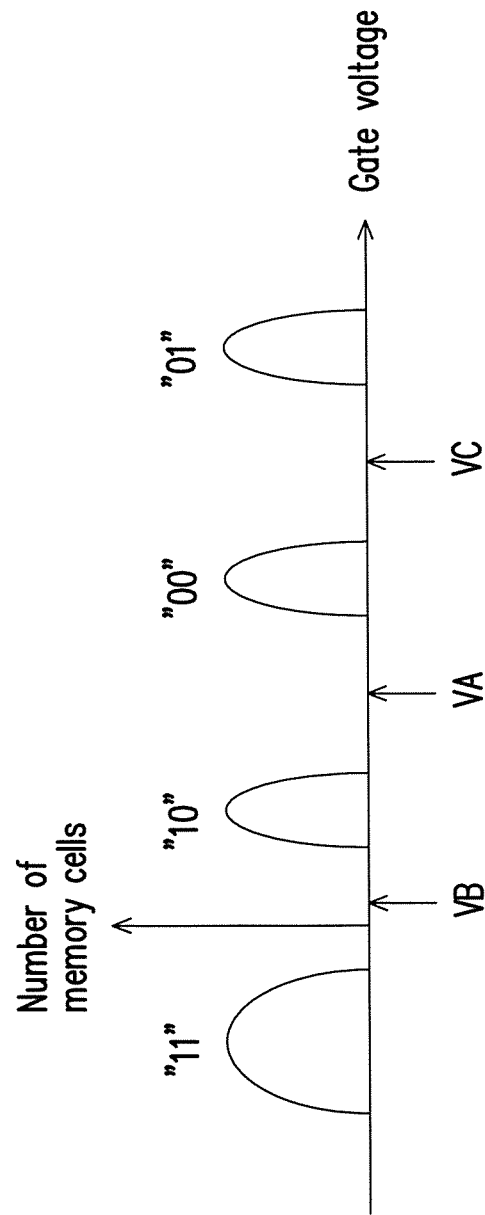
FIG. 8 is a corresponding statistical distribution diagram of gate voltages of data stored in a memory cell array according to an exemplary embodiment.

FIG. 8 is a corresponding statistical distribution diagram of gate voltages of data stored in a memory cell array according to an exemplary embodiment.

Referring to FIG. 8, taking a MLC NAND flash memory as an example, the gate voltage in each memory cell can be distinguished into 4 storage states according to a first predetermined reading voltage VA, a second predetermined reading voltage VB, and a third predetermined reading voltage VC, and these storage states respectively represent "11", "10", "00", and "01". In other words, each storage state includes the least significant bit (LSB) and the most significant bit (MSB). In the present exemplary embodiment, the first bit from the left of the storage state (i.e., "11", "10", "00", and "01") is the LSB, and the second bit from the left of the storage state is the MSB. Therefore, in the exemplary embodiment, one cell may store 2 bits of data. It should be understood that the gate voltages and the corresponding storage states illustrated in FIG. 8 are only examples. In another exemplary embodiment of the invention, the storage states may also have such an arrangement as "11", "10", "01", and "00" along with the increase of the gate voltages. Or, the storage states corresponding to the gate voltages may also be values obtained by mapping or inverting actual storage values. Additionally, in yet another exemplary embodiment, the first bit from the left may also be defined as the MSB while the second bit from the left as the LSB.

In the case of that each memory cell stores 2 bits of data, the memory cells on the same word line constitute a storage space of 2 physical programming units (i.e., a lower physical programming unit and an upper physical programming unit). Namely, the LSB of each memory cell is corresponding to the lower physical programming unit, and the MSB of each memory cell is corresponding to the upper physical programming unit. Besides, several physical programming units in the memory cell array 2202 constitute a physical erasing unit, and the physical erasing unit is the smallest unit for performing the erasing operation. That is to say, each of the physical erasing unit has a minimum number of memory cells for being erased altogether.

To write (or to program) data to a memory cell of the memory cell array 2202, a voltage (e.g., a gate voltage) applied to a certain terminal in the memory cell is controlled to change the electron volume in a charge-trapping layer in the gate, so that the conduction state of the channel of the memory cell is changed to present a different storage state. For example, when the data of the lower physical programming unit is 1 and the data of the upper physical programming unit is also 1, the control circuit 2212 controls the word line control circuit 2204 to not change the gate voltage in the memory cell, so as to keep the storage state of the memory cell as "11". When the data of the lower physical programming unit is 1 and the data of the upper physical programming unit is also 0, the control circuit 2212 controls the word line control circuit 2204 to change the gate voltage in the memory cell such that the storage state of the memory cell is changed to "10". When the data of the lower physical programming unit is 0 and the data of the upper physical programming unit is also 0, the control circuit 2212 controls the word line control circuit 2204 to change the gate voltage in the memory cell such that the storage state of the memory cell is changed to "00". And, when the data of the lower physical programming unit is 0 and the data of the upper physical programming unit is also 1, the control circuit 2212 controls the word line control circuit 2204 to change the gate voltage in the memory cell such that the storage state of the memory cell is changed to "01".

Figure 9:
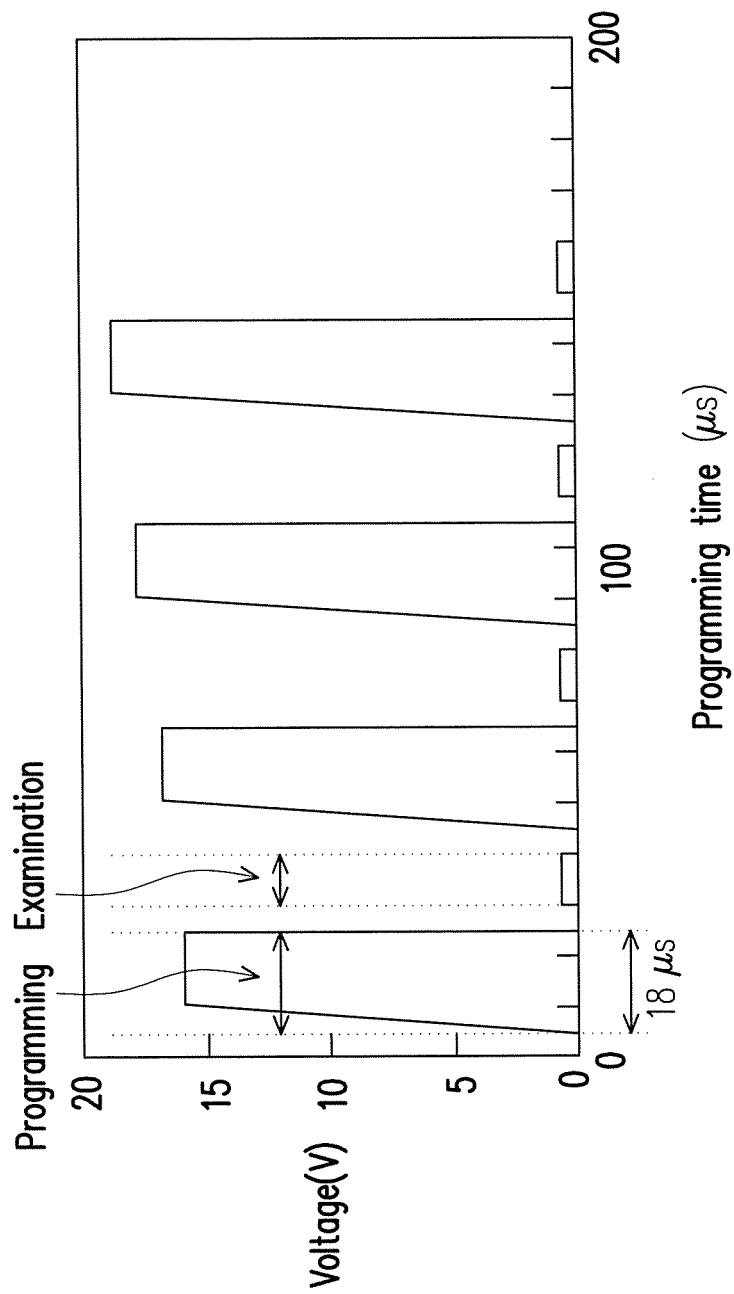
FIG. 9 is a diagram illustrating the programming of memory cell according to an exemplary embodiment.

FIG. 9 is a diagram illustrating the programming of a memory cell according to an exemplary embodiment of the invention.

Referring to FIG. 9, in the present exemplary embodiment, the memory cell is programmed through applying a pulse writing/threshold voltage verifying method. To be specific, the memory control circuit unit 104 may set an initial writing voltage and a pulse time of writing voltage, and indicate the control circuit 2212 of the rewritable non-volatile memory module 106 to use the set initial writing voltage and the pulse time of writing voltage to program the memory cell to perform the writing of data. The memory controller 104 then verifies the memory cell by means of a verification voltage, so as to determine whether the memory cell is in the correct storage state. If the memory cell is not programmed to the correct storage state, the memory control circuit unit 104 may indicate the control circuit 2212 to add an Incremental-step-pulse programming (ISPP) adjustment value to the applying writing voltage as a new writing voltage (also called duplicated writing voltage) and, according to the new writing voltage and the pulse time of the writing voltage, program the memory cell again. On the opposite, when the memory cell is programmed to the correct storage state, it is determined that the data is correctly written into the memory cell. For example, the initial writing voltage may be set to be 16 volta-ge(V), the pulse time of writing voltage may be set to be 18 microseconds (μs) and the ISPP adjustment value may be set to be 0.6 V, and the present invention is not limited thereto.

Figure 10:
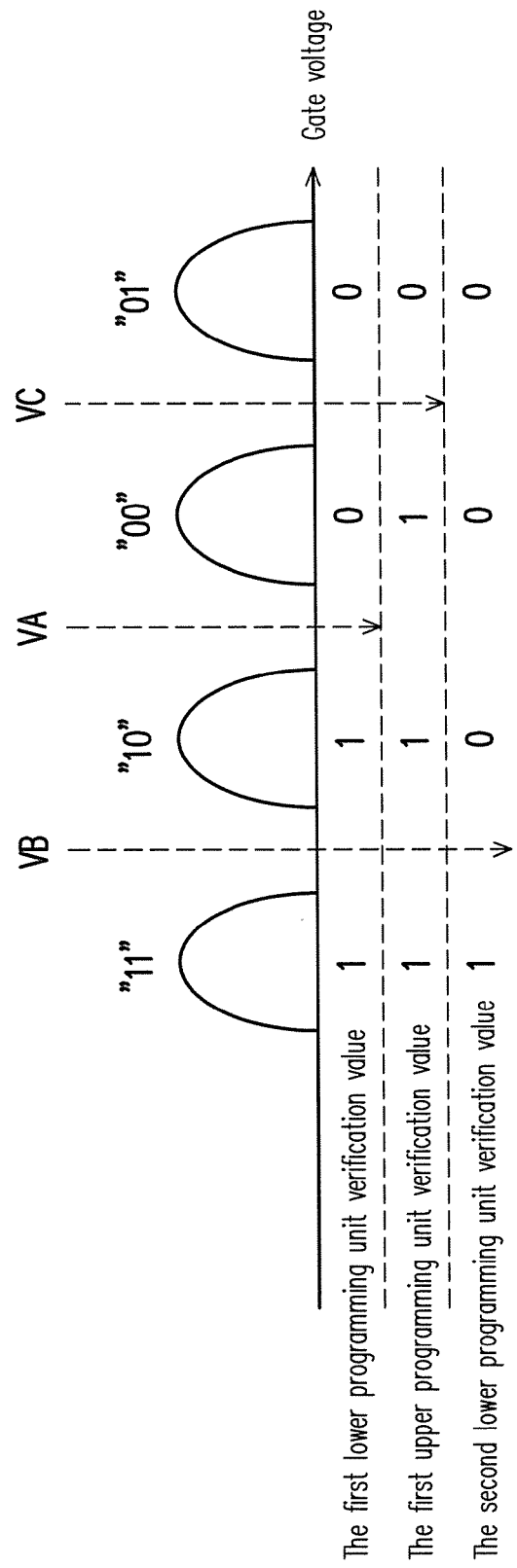
FIG. 10 is a diagram illustrating an operation of reading data from a memory cell according to an exemplary embodiment.

FIG. 10 is a diagram illustrating an operation of reading data from a memory cell according to an exemplary embodiment.

Referring to FIG. 10, in order to read data from a memory cell of the memory cell array 2202, a voltage for reading data is applied to a control gate; by means of the conduction state of a channel of the memory cell, the data stored in the memory cell may be indicated. Here, the channel of the memory cell refers to an electrical connection path between the bit lines and the source lines of the memory cell (e.g., the path between the source and the drain of the memory cell). In an operation of reading the data in the lower physical programming unit, the word line control circuit 2204 applies a first predetermined reading voltage VA as the reading voltage to the memory cell and determines the value of the data in the lower physical programming unit according to whether the channel of the memory cell is conducted and the corresponding formula (1):

$$LSB=(VA)Lower\_pre1 \qquad (1)$$

wherein $(VA)Lower\_pre1$ represents a first lower physical programming unit verification value which is obtained by applying the first predetermined reading voltage VA.

For example, when the first predetermined reading voltage VA is smaller than the gate voltage of a memory cell, the control gate of the memory cell is not conducted and thus outputs the first lower physical programming unit verification value that is "0". Therefore, the LSB of the memory cell is identified as a first state as "0". For example, when the first predetermined reading voltage VA is larger than the gate voltage of a memory cell, the control gate of the memory cell is conducted and thus outputs the first lower physical programming unit verification value that is "1". Therefore, the LSB of the memory cell is identified as a second state as "1". Here, the first state is identified as "0" and the second state is identified as "1". Namely, the gate voltage for presenting the LSB as value 1 and the gate voltage for presenting the LSB as value 0 can be distinguished by the first predetermined reading voltage VA.

In the operation of reading the data of the upper physical programming unit, the word line control circuit 2204 respectively applies a second predetermined reading voltage VB and a third predetermined reading voltage VC as the reading voltages to the memory cell and determines the value of the data of the upper physical programming unit according to whether the channel of the memory cell is conducted and the corresponding formula (2):

$$MSB=((VB)Upper\_pre2)XOR(\sim(VC)Upper\_pre1) \quad (2)$$

wherein (VC)Upper_pre1 represents the first upper physical programming verification value which is obtained by applying the third predetermined reading voltage VC, and (VB)Upper_pre2 epresents a second upper physical programming verification value which is obtained by applying the second predetermined reading voltage VB, wherein the symbol '~' represents an invert. Additionally, in the exemplary embodiment, when the third predetermined reading voltage VC is smaller than the gate voltage of a memory cell, the control gate of the memory cell is not conducted and outputs the first upper physical programming unit verification value ((VC)Upper_pre1) that is "1"; and when the second predetermined reading voltage VB is smaller than the gate voltage of the memory cell, the control gate of the memory cell is not conducted and outputs the second upper physical programming unit verification value ((VB)Upper_pre2) that is "1".

Therefore, according to the formula (2), when the third predetermined reading voltage VC and the second predetermined reading voltage VB are both smaller than the gate voltage of a memory cell, the control gate of the memory cell is not conducted and outputs the first upper physical programming unit verification value that is "0" when the third predetermined reading voltage VC is applied; and the control gate of the memory cell is not conducted and outputs the second upper physical programming unit verification value that is "0" when the second predetermined reading voltage VB is applied. Here, the MSB is identified as the second state, namely, "1".

For example, when the third predetermined reading voltage VC is larger than the gate voltage of a memory cell and the second predetermined reading voltage VB is smaller than the gate voltage of a memory cell, the control gate of the memory cell is conducted and outputs the first upper physical programming unit verification value that is "1" when the third predetermined reading voltage VC is applied, and the control gate of the memory cell is not conducted and outputs the second upper physical programming unit verification value that is "0" when the second predetermined reading voltage VB is applied. Here, the MSB is identified as the first state, namely, "0".

For example, when the third predetermined reading voltage VC and the second predetermined reading voltage VB are both larger than the gate voltage of a memory cell, the control gate of the memory cell is conducted and outputs the first upper physical programming unit verification value that is "1" when the third predetermined reading voltage VC is applied, and the control gate of the memory cell is conducted and outputs the second upper physical programming unit verification value that is "1" when the second predetermined reading voltage VB is applied. Here, the MSB is identified as the second state, namely, "1".

It should be noted that a MLC NAND flash memory is just used for explaining the invention in the exemplary embodiment. However, the invention is not limited thereto. In other exemplary embodiments, data stored in other type of multiple layers memory cell NAND flash memory may be read based on the principle described above.

Figure 11:
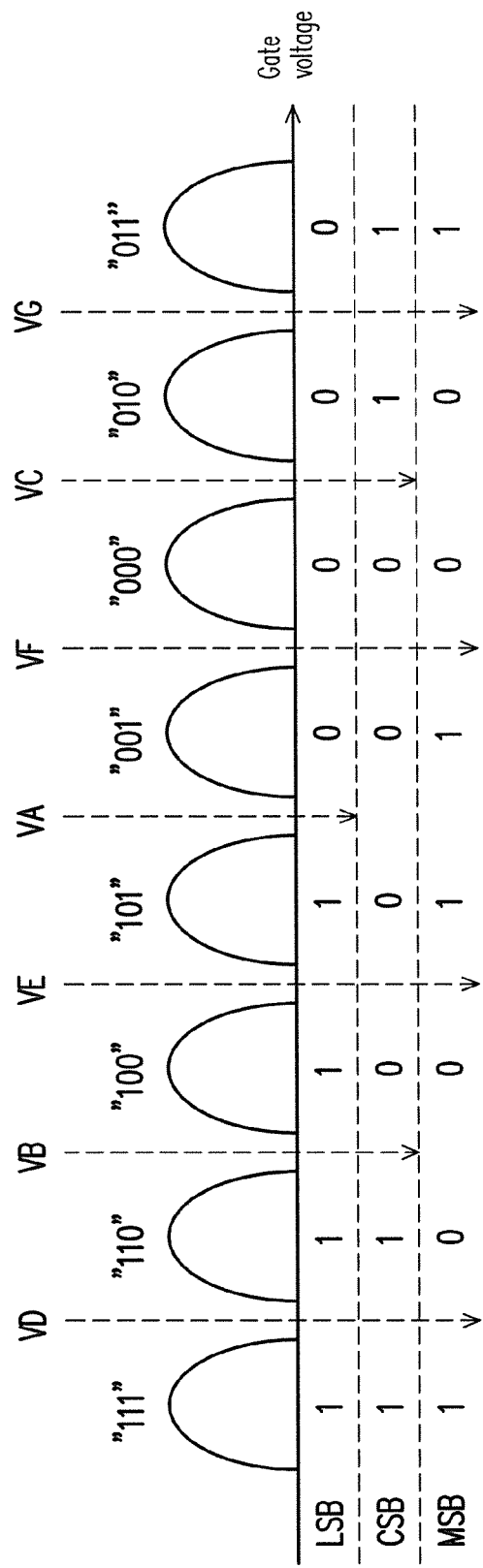
FIG. 11 is a diagram illustrating an operation of reading data from a memory cell according to another exemplary embodiment.

Taking a TLC NAND flash memory (as shown in FIG. 11) as an example, each storage state includes a LSB (the first bit from the left), a center significant bit (CSB, the second bit from the left), and a MSB (the third bit from the left), wherein the LSB is corresponding to a lower physical programming unit, the CSB is corresponding to a middle physical programming unit, and the MSB is corresponding to an upper physical programming unit. In this example, the gate voltage in each memory cell is distinguished into 8 storage states (i.e., "111", "110", "100", "101", "001", "000", "010", and "011") according to a first predetermined reading voltage VA, a second predetermined reading voltage VB, a third predetermined reading voltage VC, a fourth predetermined reading voltage VD, a predetermined reading threshold voltage VE, a predetermined reading threshold voltage VF, and a seventh predetermined reading voltage VG.

Figure 12A:
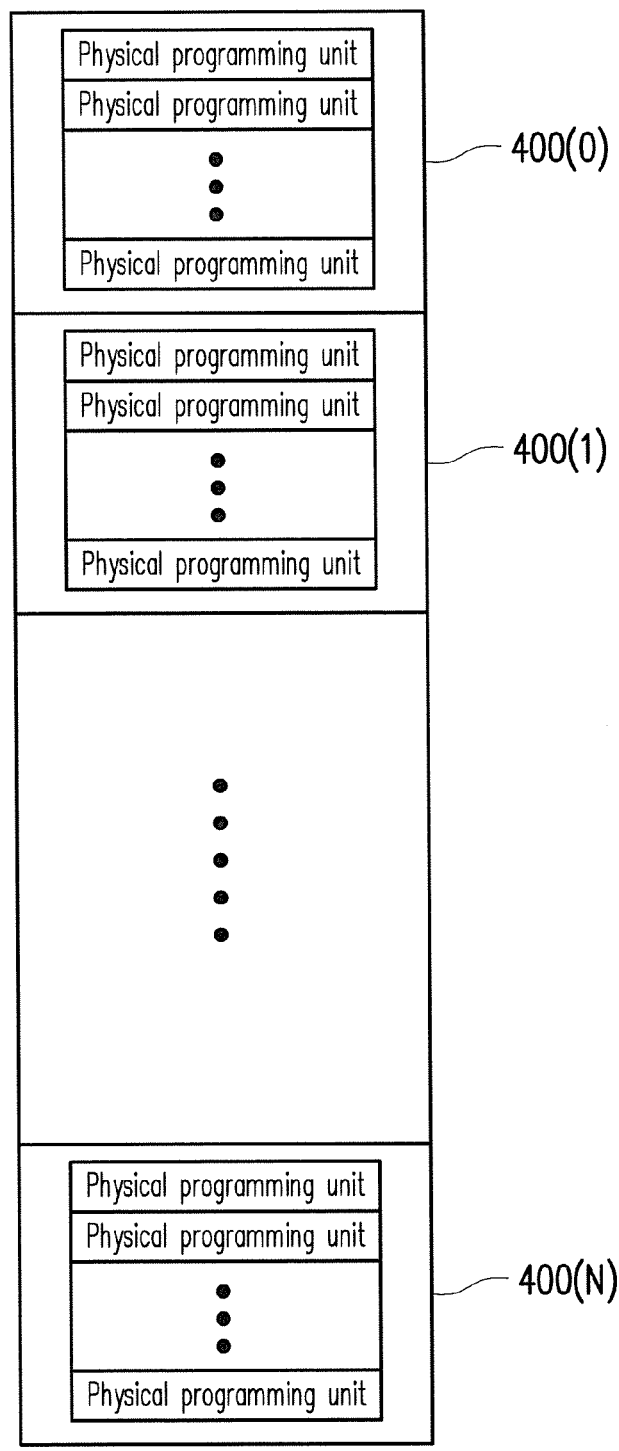
FIG. 12A, FIG. 12B and FIG. 12C are exemplary diagrams illustrating managing physical erasing units according to an exemplary embodiment.
Figure 12B:
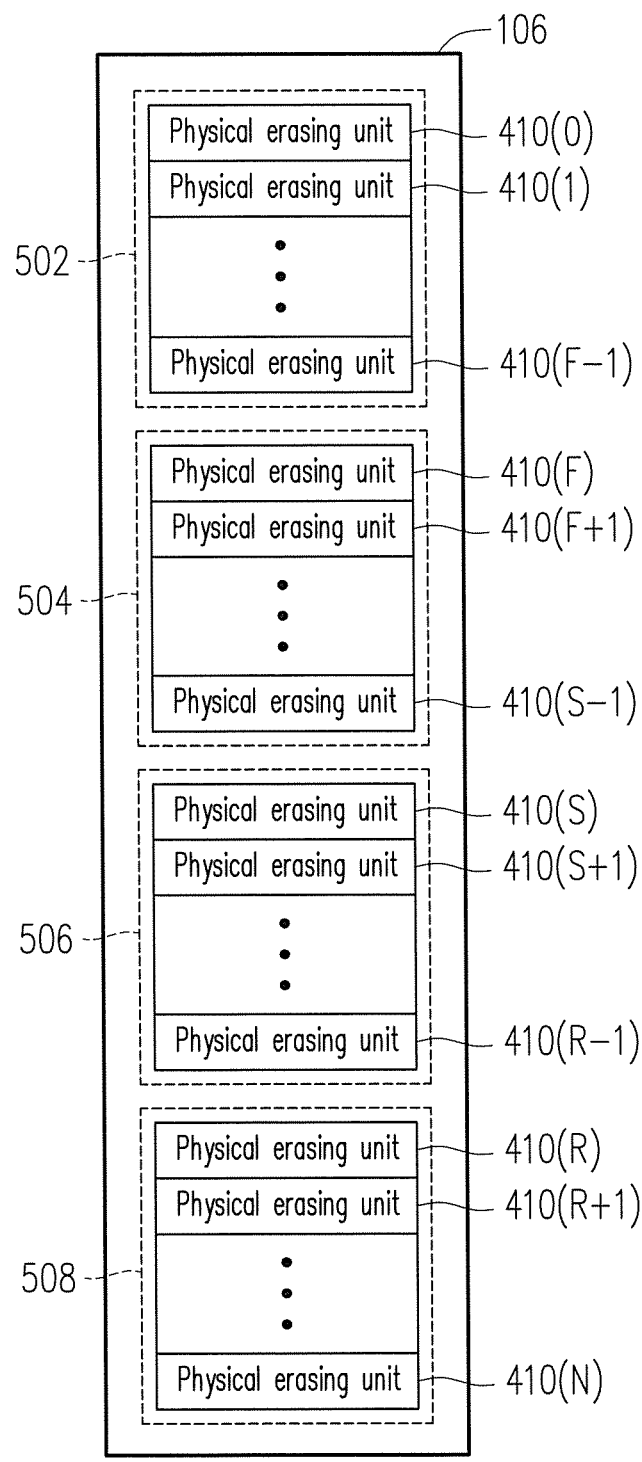
Figure 12C:
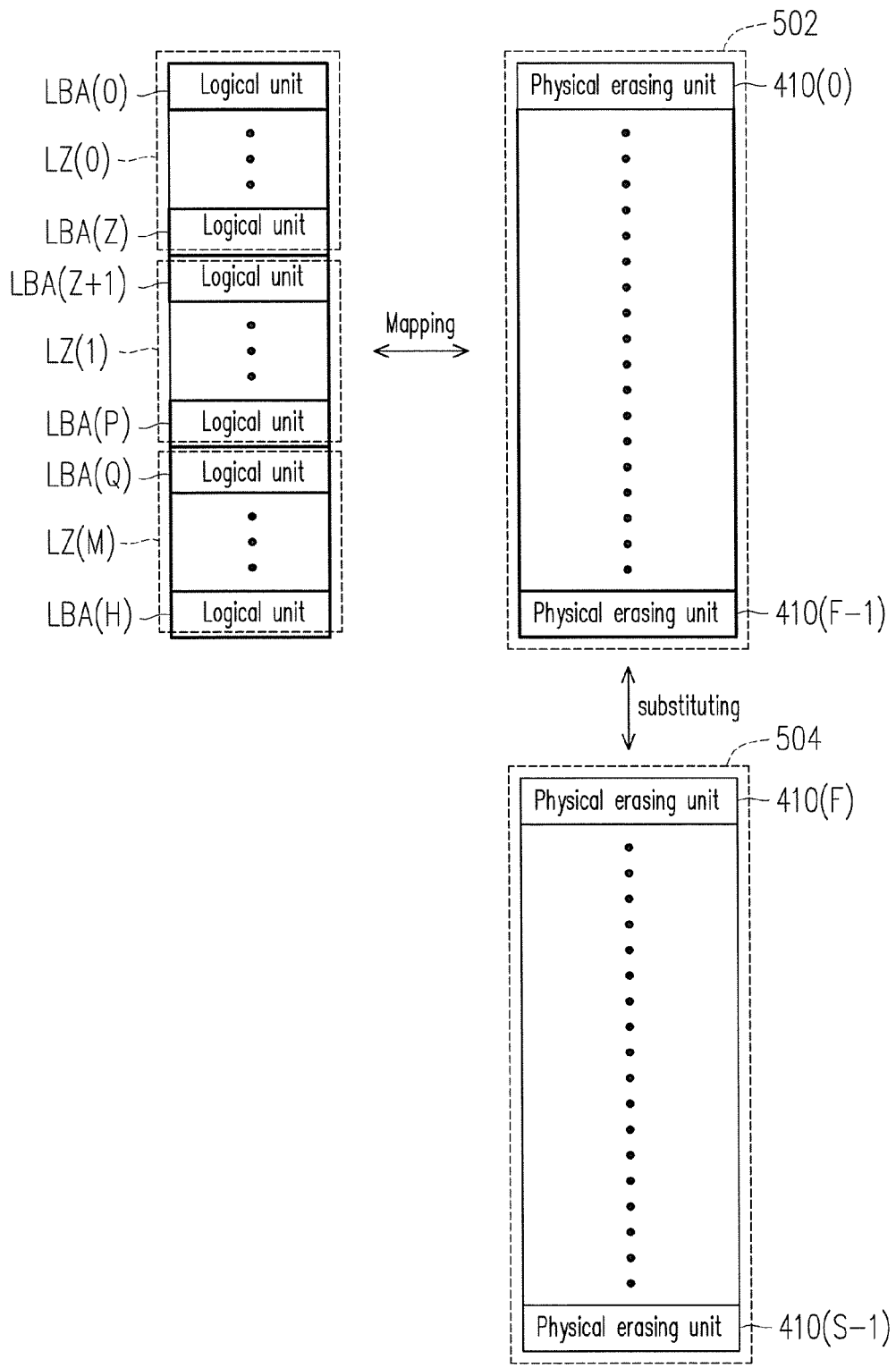

FIG. 12A, FIG. 12B and FIG. 12C are exemplary diagrams illustrating managing physical erasing units according to an exemplary embodiment of the invention.

Referring to FIG. 12A, the memory control circuit unit 104 (or memory management circuit 202) may take the physical programming unit as an unit for performing the writing operation to the memory cells 702 of the rewritable non-volatile memory module 106 and performing the erasing operation to the memory cells of the rewritable non-volatile memory module 106. To be specific, the memory cells 702 of the rewritable non-volatile memory module 106 constitute a plurality of physical programming units, and the physical programming units constitute a plurality of physical erasing units 400(0)-410(N). The physical erasing unit is the smallest erasing unit. That is to say, each of the physical erasing unit has a minimum number of memory cells for being erased altogether. The physical programming unit is the minimum programming unit. Namely, a physical programming unit is the minimum unit for writing the data. Each physical programming unit usually includes a data bit area and a redundant bit area. The data bit area includes several physical accessing addresses for storing user data, and the redundant bit area is used for storing system data (e.g., control information and error correcting codes (ECC)). Taking the TLC NAND flash memory as an example, the LSB of the memory cells of the same one word line may constitute one lower physical programming unit; the CSB of the memory cells of the same one word line may constitute one middle physical programming unit; the MSB of the memory cells of the same one word line may constitute one upper physical programming unit.

Referring to FIG. 12B, the memory control circuit unit 104 (or memory management circuit 202) logically groups the physical erasing units 410(0)~410(N) into a data area 502, a spare area 504, a system area 506, and a replacement area 508. The physical erasing units logically belonging to the data area 502 and the spare area 504 are used for storing data from the host system 1000. To be specific, the physical erasing units of the data area 502 are the physical erasing units which have been used for storing data, and the physical erasing units of the spare area 504 are the physical erasing units which are used for substituting the physical erasing units of the data area 502. Namely, when a write command and a data to be written are received from the host system 1000, the memory control circuit unit 104 (or memory management circuit 202) takes a physical erasing unit from the spare area 504 and writes the data into the taken physical erasing unit for substituting the physical erasing units of the data area 502.

The physical erasing units logically belonging to the system area 506 are used for recording system data. For instance, the system data includes the manufacturers and models of the rewritable non-volatile memory module, the number of physical erasing units in the rewritable non-volatile memory modules, the number of physical programming units in each physical erasing unit, and so on.

The physical erasing units logically belonging to the replacement area 508 are used in a bad physical erasing unit replacement procedure for replacing damaged physical erasing units. Particularly, if there are still normal physical erasing units in the replacement area 508, and a physical erasing unit in the data area 502 is damaged, the memory management circuit 202 selects a normal physical erasing unit from the replacement area 508 to replace the damaged physical erasing unit.

In particular, the numbers of physical erasing units in the data area 502, the spare area 504, the system area 506 and the replacement area 508 are various based on different memory module standards. Additionally, it has to be understood that the grouping relationships of grouping the physical erasing units into the data area 502, the spare area 504, the system area 506 and the replacement area 508 are dynamically changed during the operation of the memory storage apparatus 100. For example, when a physical erasing unit in the spare area 504 is damaged and replaced by a physical erasing unit in the replacement area 508, the physical erasing unit in the replacement area 508 is associated with the spare area 504.

Referring to FIG. 12C, the memory control circuit unit 104 (or memory management circuit 202) configures a plurality of logical units LBA(0)~LBA(H) for mapping the physical erasing units of the data area 502, wherein each of the logical units includes a plurality of logical sub-units for orderly mapping the physical programming units of the corresponding physical erasing units. Also, when the host system intends to write data into a logical unit or update the data stored in a logical unit, the memory control circuit unit 104 (or memory management circuit 202) may select a physical erasing unit to write the data for substituting the physical erasing units of the data area 502. In the present exemplary embodiment, the logical sub-unit may be a logical page or a logical sector.

In order to recognize in which physical erasing unit the data of each logical unit is stored, in the exemplary embodiment, the memory control circuit unit 104 (or memory management circuit 202) may record the mapping between logical units and physical erasing units. Also, when the host system 1000 intends to access data from a logical sub-units, the memory control circuit unit 104 (or memory management circuit 202) may confirm to which logical unit this logical sub-unit belongs, and issue a corresponding command sequence to access data from the physical erasing unit mapped to this logical unit. For example, in the exemplary embodiment, the memory control circuit unit 104 (or memory management circuit 202) may save a logical-physical address mapping table in the rewritable non-volatile module 106 to record the physical erasing units mapped to each logical units, and the memory control circuit unit 104 (or memory management circuit 202) may load the logical-physical address mapping table into the buffer memory 208 for maintaining when it intends to access data.

Figure 13:
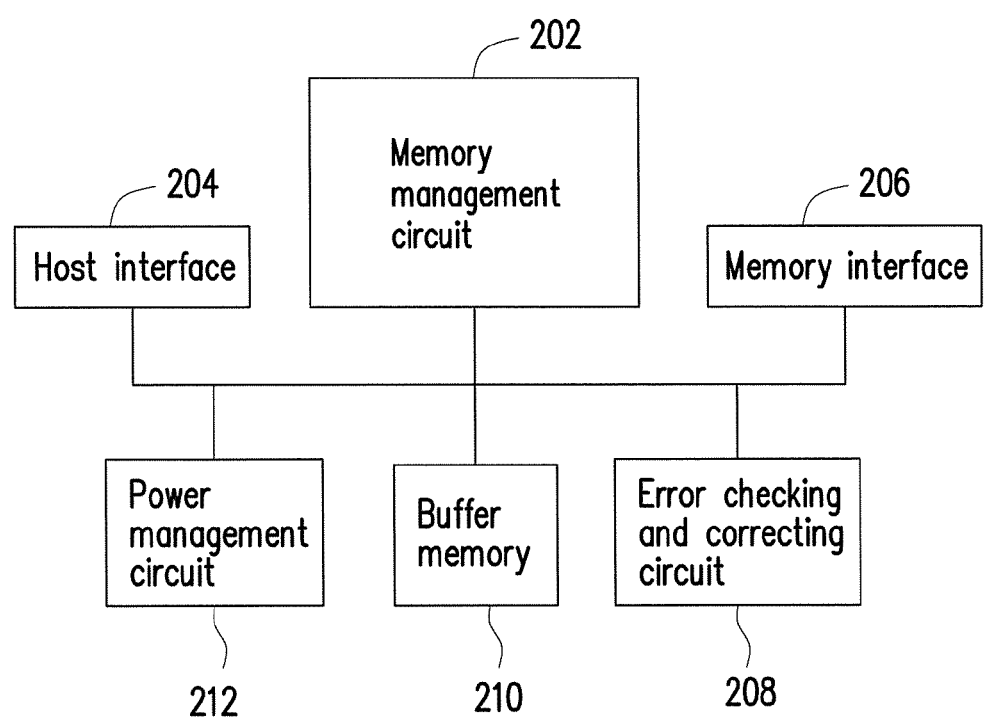
FIG. 13 is a schematic block diagram illustrating a memory control circuit unit according to an exemplary embodiment.

FIG. 13 is a schematic block diagram illustrating a memory control circuit unit according to an exemplary embodiment. It should be understood that the memory control circuit unit depicted in FIG. 13 is merely exemplary and should not be construed as a limitation to the invention.

Please refer to FIG. 13, the memory control circuit unit 104 includes a memory management circuit 202, a host interface 204, a memory interface 206 and an error checking and correcting (ECC) circuit 208.

The memory management circuit 202 is configured to control the whole operation of the memory control circuit unit 104. Particularly, the memory management circuit 202 has a plurality of control command; when the memory storage apparatus 100 is operated, the control commands are executed to perform a data writing operation, a data reading operation, a data erasing operation, and so on.

In the exemplary embodiment, the control commands of the memory management circuit 202 are implemented in a form of a firmware. For example, the memory management circuit 202 includes a microprocessor unit (not shown) and a read-only memory (ROM, not shown), where the control commands are burned into the read-only memory. When the memory storage apparatus 100 is operated, the control commands are executed by a microprocessor unit to write, read, and erase data.

In another exemplary embodiment of the invention, the control commands of the memory managing circuit 202 may also be stored in a specific block (for example, a system block in a memory module exclusively used for storing system data) of the rewritable non-volatile memory module 106 as a programming code. Moreover, the memory managing circuit 202 includes a microprocessor unit (not shown), a read-only memory (ROM, not shown) and a random access memory (not shown). In particular, the ROM has a boot code, and when the memory control circuit unit 104 is enabled, the microprocessor unit first executes the boot code to load the control commands from the rewritable non-volatile memory module 106 into the RAM of the memory management circuit 202. The microprocessor unit then executes the control commands to write, read, and erase data.

Furthermore, as in another exemplary embodiment, the control commands in the memory management circuit 202 are implemented in a form of hardware. For example, the memory management circuit 202 includes a micro controller, a memory cell managing circuit, a memory writing circuit, a memory reading circuit, a memory erasing circuit and a data processing circuit. The memory managing circuit, the memory writing circuit, the memory reading circuit, the memory erasing circuit and the data processing circuit are coupled to the micro controller. Wherein, the memory management circuit is configured for managing the physical erasing units of the rewritable non-volatile memory module 106; the memory writing circuit is configured for issuing the write command to the rewritable non-volatile memory module 106 in order to write the data into the rewritable non-volatile memory module 106; the memory reading circuit is configured for issuing the read command to the rewritable non-volatile memory module 106 in order to read the data from the rewritable non-volatile memory module 106, the memory erasing circuit is configured for issuing the erase command to the rewritable non-volatile memory module 106 in order to erase the data in the rewritable non-volatile memory module 106, and the data processing circuit is configured for processing the data which is intended to be written into the rewritable non-volatile memory module 106 and the data which is intended to be read from the rewritable non-volatile memory module 106.

The host interface 204 is coupled to the memory management circuit 202 and configured to receive and identify the commands and the data transmitted by the host system 1000. That is to say, the commands and data transmitted by the host system 1000 are passed to the memory management circuit 202 through the host interface 204. In the exemplary embodiment, the host interface 204 complies with the USB standard. However, it should be understood that the invention is not limited hereto, and the host interface 204 can also comply with the PATA standard, the IEEE 1394 standard, the PCI Express standard, the SD standard, the SATA standard, the UHS-I standard, the UHS-II standard, the MS standard, the MMC standard, the eMMC standard, the UFS standard, the CF standard, the IDE standard, or any other appropriate data transmission standard.

The memory interface 206 is coupled to the memory management circuit 202 for accessing the rewritable non-volatile memory module 106. In other words, the data intended to be written to the rewritable non-volatile memory module 106 is converted to an acceptable format for the rewritable non-volatile memory module 106 by the memory interface 206.

The error checking and correcting circuit 208 is coupled to the memory management circuit 202 and configured for executing an error correcting procedure to ensure the accuracy of data. To be specific, when the memory management circuit 202 reads data from the rewritable non-volatile memory module 106, the error checking and correcting circuit 208 executes the error correcting procedure for the read data. For example, in the exemplary embodiment, the error checking and correcting circuit 208 is a low density parity check (LDPC) circuit and stores a log likelihood ratio (LLR) value table. When the memory management circuit 202 reads data from the rewritable non-volatile memory module 106, the error checking and correcting circuit 208 executes the error correcting procedure according to the read data and a corresponding LLR value in the LLR value table. It should be understood that the error checking and correcting circuit 208 may be a turbo code circuit in another exemplary embodiment.

In an exemplary embodiment, the memory control circuit unit 104 further includes a buffer memory 210 and a power management circuit 212.

The buffer memory 210 is coupled to the memory management circuit 202 and configured to temporarily store the data and commands from the host system 1000 or the data from the rewritable non-volatile memory module 106.

The power management circuit 212 is coupled to the memory management circuit 202 and configured to control the power of the memory storage apparatus 100.

Figure 14:
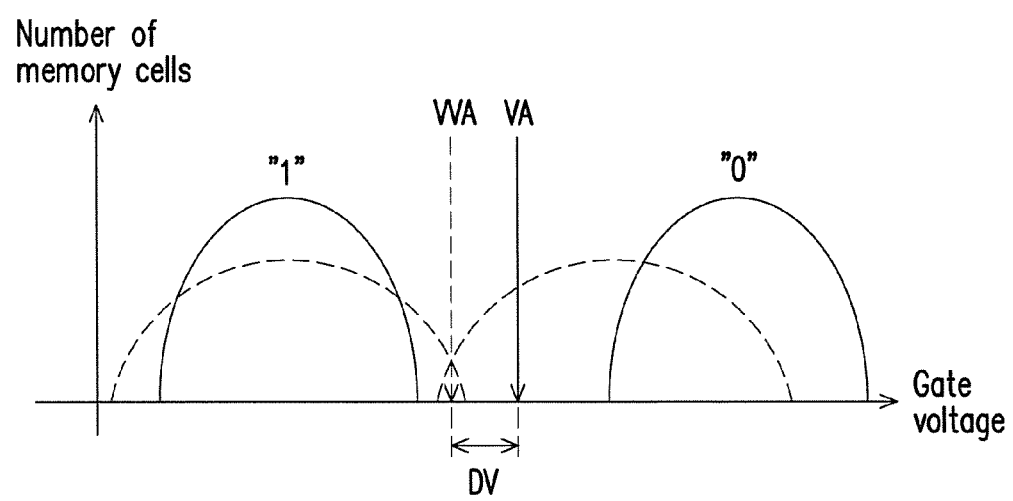
FIG. 14 is a corresponding statistical distribution diagram of gate voltages of data stored in a memory array after programming and erasing memory cell according to an exemplary embodiment.

FIG. 14 is a corresponding statistical distribution diagram of gate voltages of data stored in a memory array according to an exemplary embodiment. It should be mentioned, the statistical distribution diagram of gate voltages corresponding to the memory cell may also refer to the critical voltage distribution of the memory cell. For ease of description of the invention, it takes the lower physical programming unit which is constituted by the LSB of the memory cells of the MLC NAND flash memory for an example below.

Referring to FIG. 14, a float voltage of each memory cell is determined into 2 kinds of the storage states according to a first predetermined reading voltage VA (as the curve shown in FIG. 14), and the storage states respectively represent "1" and "0".

In general, when it is intended to read data from a memory cell, the memory control circuit unit 104 (or memory management circuit 202) may give a read command to the rewritable non-volatile memory module 106, and the control circuit 2212 of the rewritable non-volatile memory circuit 106 may apply a predetermined reading voltage to the word line connecting to the memory cell which is about to be read for determining the storage state of the memory cell. Moreover, the control circuit 2212 may also apply multiple scanning voltages to the word line, and read the identified bit data corresponding to each scanning voltage from several memory cells which are connected to the word line. And then, respectively calculate several first state bit data increments from the bit data which are identified as the first state from the identified bit data corresponding to several scanning voltages. Finally, it may, according to the first state bit data increments, obtain the critical voltage distribution of the memory cells, which are identified as the first state, of the word line, and, in the same manner, it may also obtain the critical voltage distribution of the memory cells, which are identified as the second state, of the word line. However, there are several possibilities for causing the shifting of the critical voltage distribution, for example, long time data storing, the wear of the memory cells, the read-disturb. Here, it is taking the long time data storing as an example. Because the data stored for a long time, the critical voltage distribution of the memory cells 702 of the rewritable non-volatile memory module 106 is shifted (as the dot line shown in FIG. 14) such that the first predetermined reading voltage VA cannot identify the storage states of the memory cells. That is, when the gate voltage of the memory cell (hereinafter, refers to the first memory cell) in FIG. 14 is programmed to "0" identified bit states, the gate voltage of the first memory cell would be larger than the first predetermined reading voltage VA. So that, when it uses the first predetermined reading voltage VA to obtain the identified bit of the first memory cell, it is supposed to obtain the "0" identified bit state but the wrong "1" identified bit state because of the shifting of the critical voltage distribution.

When the memory control circuit unit 104 (or memory management circuit 202) performs a reading operation to the first word line, which includes the first memory cell, with the first predetermined reading voltage VA, because of the shifting of the critical voltage distribution, it would lead the obtained identified bit of the several memory cells of the first word line to be wrong. In other word, when the identified bit of one memory cell is wrong, it represents that the stored one bit data of the memory cell is wrong, and it occurs one error bit. When several identified bits, which is read from several memory cells of a word line, are wrong, it represents that the data, which is read from this word line, has several error bits. And, when the number of the error bit of the read data is larger than the protective ability of the error checking and correcting circuit 208, the data cannot be decoded correctly, and then the error bits in the read data cannot be corrected.

In the exemplary embodiment, when the critical voltage distribution is shifted, the memory control circuit unit 104 (or memory management circuit 202) may perform an adjustment according to the first predetermined reading voltage VA to obtain a voltage (hereinafter, refers to the first available reading voltage VVA) which is capable of correcting the read data successfully. That is, the data which is read by applying the first available reading voltage VVA to the first word line may be corrected by the error checking and correcting circuit 208 successfully. Especially, after successfully correcting the data (hereinafter, refers to the first page data) which is read through the first available reading voltage VVA, the memory control circuit unit 104 (or memory management circuit 202) may determine whether the first difference DV between the used the first available reading voltage VVA and the first predetermined reading voltage VA is larger than the first predetermined threshold value. When the first difference DV is larger than the first predetermined threshold value, the memory control circuit unit 104 (or memory management circuit 202) may give a command sequence to indicate the rewritable non-volatile memory module 106 to program the first page data into a physical programming unit (for example, a first physical programming unit which is constituted by several memory cells connecting to the second word line), which is constituted by several memory cells connecting to the other word line. After finishing the programming operation for the first page data, the logical sub-unit (hereinafter, refers to the first logical sub-unit) that the first page data belongs to would be remapped to the foregoing first physical programming unit on the second word line. And then, the operation of programming the first page data into a physical programming unit which is constituted by several memory cells connecting to the other word line, according to the result of determining whether the first difference DV between the first available reading voltage VVA and the first predetermined reading voltage VA is larger than the first threshold, is also called a read-disturb protection.

It should be mentioned, in the exemplary embodiment, by comparing whether the first difference DV between the first available reading voltage VVA and the first predetermined reading voltage VA is larger than the first predetermined threshold value to determine that if a read-disturb operation should be performed. However, the present invention is not limited thereto. For example, in an exemplary embodiment of, when reading data, the memory control circuit unit 104 (or memory management circuit 202) may obtain the first available reading voltage VVA through the retry table. Therefore, in another exemplary embodiment, the memory control circuit unit 104 (or memory management circuit 202) may also, according to the number of times of performing the retry read operation, determine if the read-disturb protection operation shall be performed.

FIG. 15 is a diagram illustrating a retry table according to an exemplary embodiment.

Please refer to FIG. 15, for ease of description, in FIG. 15, there is a simplified retry table 1501 in which it records every adjustment voltage for performing retry read operation to the LSB of the memory cells of a word line, and only defines ten times retry read operations. It should be understood, in another exemplary embodiment, the retry table may store more adjustment voltages for the retry read operations, and the retry table may also record the adjustment voltages for other bits (e.g., MSB, CSB) of the memory cells.

In the retry table 1501 in FIG. 15, the field "retry read operation times 1503" may record the retry read operation times, and the field "adjustment voltage 1505" may record the voltage value (hereinafter, refers to the first reading voltage adjustment value) which is used for adjustment, corresponding to the retry times, and the unit of the values is Voltage (V). For example, #1 is the first retry read operation, and the corresponding adjustment voltage is −0.3V, so, #2 is the second retry read operation, and the corresponding adjustment voltage is −0.5V. For example, when the page data (hereinafter, refers to the first page data) which is read from the first word line by memory control circuit unit 104 (or memory management circuit 202) with the first predetermined reading voltage VA cannot be corrected, the memory control circuit unit 104 (or memory management circuit 202) may indicate the rewritable non-volatile memory module 106 to perform a retry read operation according to the retry table 1501. That is, when performing the first time retry read operation, the memory control circuit unit 104 (or memory management circuit 202) adjusts the first predetermined reading voltage VA with the first reading voltage adjustment value. If the data read by performing the reading operation with the voltage value, which is the first reading voltage adjustment value plus the first predetermined reading voltage VA (for example, (−0.3)+VA), can be corrected by the error checking and correcting circuit 208 accurately, the voltage value is the first available reading voltage VVA. But, when performing the first time retry read operation, the first reading voltage adjustment value which is used by the memory control circuit unit 104 (or memory management circuit 202) may not necessarily cause the first page data to be corrected accurately, and then the memory control circuit unit 104 (or memory management circuit 202) may according to the retry table perform the second time retry read operation #2, the third time retry read operation #3, the fourth time retry read operation #4, and so on, till the first page data is corrected accurately. When the used voltage may cause the first page data to be corrected accurately, the used voltage is the first available reading voltage VVA. That is, the memory control circuit unit 104 (or memory management circuit 202) may, according to the retry table 1501, perform retry read operation to obtain the first available reading voltage VVA. It should be mentioned, when the first page data may be read correctly by using the first predetermined reading voltage VA, it shall not perform the retry read operation, and the first predetermined reading voltage VA at this time is the first available reading voltage VVA.

In the exemplary embodiment, the memory control circuit unit 104 (or memory management circuit 202) may, according to the number of times of retry read operations performed, determine whether the first difference DV between the used first available reading voltage VVA and the first predetermined reading voltage VA is larger than the first predetermined threshold value. For example, in FIG. 15, the fourth reading voltage adjustment value of the fourth retry read operation #4 is −1V, and the fifth reading voltage adjustment value of the fifth retry read operation #5 is −1.3V. That is, the voltage adjustment of the fifth retry read operation #5 and the retry read operations before the fifth retry read operation #5 are going to minus the first predetermined reading voltage VA. The more retry times, the larger voltage adjustment value which would minus the first predetermined reading voltage VA, so that, the difference between the adjusted voltage value and the first predetermined reading voltage becomes larger. On the other hand, the voltage adjustments of the performed retry read operations between the sixth retry read operation #6 and the tenth retry read operation #10 are going to plus the first predetermined reading voltage VA. The more retry times, the larger voltage adjustment value which would plus the first predetermined reading voltage VA. So that, the difference between the adjusted voltage value and the first predetermined reading voltage becomes larger, too. And, the memory control circuit unit 104 (or memory management circuit 202), like the foregoing example, may be predefined that when the number of times of performing retry read operation for obtaining the first available reading voltage VVA is larger than three and smaller than equal to five, or larger than eight and smaller than equal to ten, the memory control circuit unit 104 (or memory management circuit 202) may determine that the first difference value DV between the used first available reading voltage VVA and the first predetermined reading voltage VA is larger than the first predetermined threshold value. On the opposite, when the number of times of performing retry read operation for obtaining the first available reading voltage VVA is smaller than equal to three, or larger than five and smaller than equal to eight, the memory control circuit unit 104 (or memory management circuit 202) may determine that the first difference value DV between the used first available reading voltage VVA and the first predetermined reading voltage VA is not larger than the first predetermined threshold value.

That is, in the exemplary embodiment, the memory control circuit unit 104 (or memory management circuit 202) may determine whether the number of times of performing retry read operations is between two predefined number (hereinafter, refers to the first predefined number and the second predefined number). And, when the number of times of performing retry read operations is between the first predefined number and the second predefined number, the memory control circuit unit 104 (or memory management circuit 202) may identify that the first difference value DV between the used first available reading voltage VVA and the first predetermined reading voltage VA is not larger than the first predetermined threshold value.

In addition to determining the shifting range between the first available reading voltage VVA and the first predetermined reading voltage VA according to the retry times, in another exemplary embodiment, the memory control circuit unit 104 (or memory management circuit 202) may also, according to the critical voltage distribution, determine whether the first difference value DV between the used first available reading voltage VVA and the first predetermined reading voltage VA is larger than the first predetermined threshold value.

Figure 16:
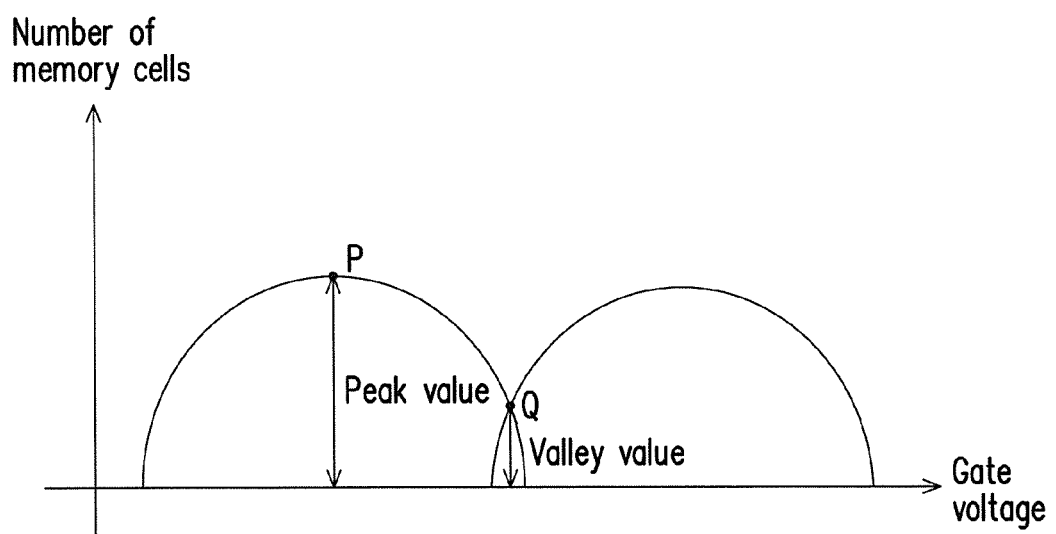
FIG. 16 is a diagram illustrating a critical voltage distribution according to another exemplary embodiment.

FIG. 16 is a diagram illustrating a critical voltage distribution according to another exemplary embodiment.

Referring to FIG. 16, in another exemplary embodiment here, the memory control circuit unit 104 (or memory management circuit 202) may search one peak value P of the peak values in built critical voltage distribution and one valley value Q which is adjacent to the peak value P, and calculate the ratio by dividing valley value Q with the peak value P. When the calculated ratio is larger than a predetermined ratio, the memory control circuit unit 104 (or memory management circuit 202) may identify that the first difference value DV between the used first available reading voltage VVA and the first predetermined reading voltage VA is larger than the first predetermined threshold value.

For example, when the memory control circuit unit 104 (or memory management circuit 202) builds the critical voltage distribution for the first word line, the memory control circuit unit 104 (or memory management circuit 202) may then compare the ratio between the peak value P and the valley value Q. For example, when the ratio which is obtained by dividing the peak value P with the valley value Q is larger than the predetermined ratio, the memory control circuit unit 104 (or memory management circuit 202) may identify that the first difference value DV between the used first available reading voltage VVA and the first predetermined reading voltage VA is larger than the first predetermined threshold value. And then, the memory control circuit unit 104 (or memory management circuit 202) may perform the read-disturb protection that is the steps of rewriting the first page data into another physical programming unit. For example, the predetermined ratio may be set as 5%, but the present invention is not limited thereto.

Moreover, in another exemplary embodiment, the memory control circuit unit 104 (or memory management circuit 202) may also record the error bit number of the data which is read with different scanning voltages, and calculate the ratio between the smallest error bit number and the largest error bit number (e.g., calculating a ratio by dividing the smallest error bit number with the largest error bit number). And, when the ratio is larger than the predetermined ratio, the memory control circuit unit 104 (or memory management circuit 202) may identify that the first difference value DV between the used first available reading voltage VVA and the first predetermined reading voltage VA is larger than the first predetermined threshold value.

Figure 17:
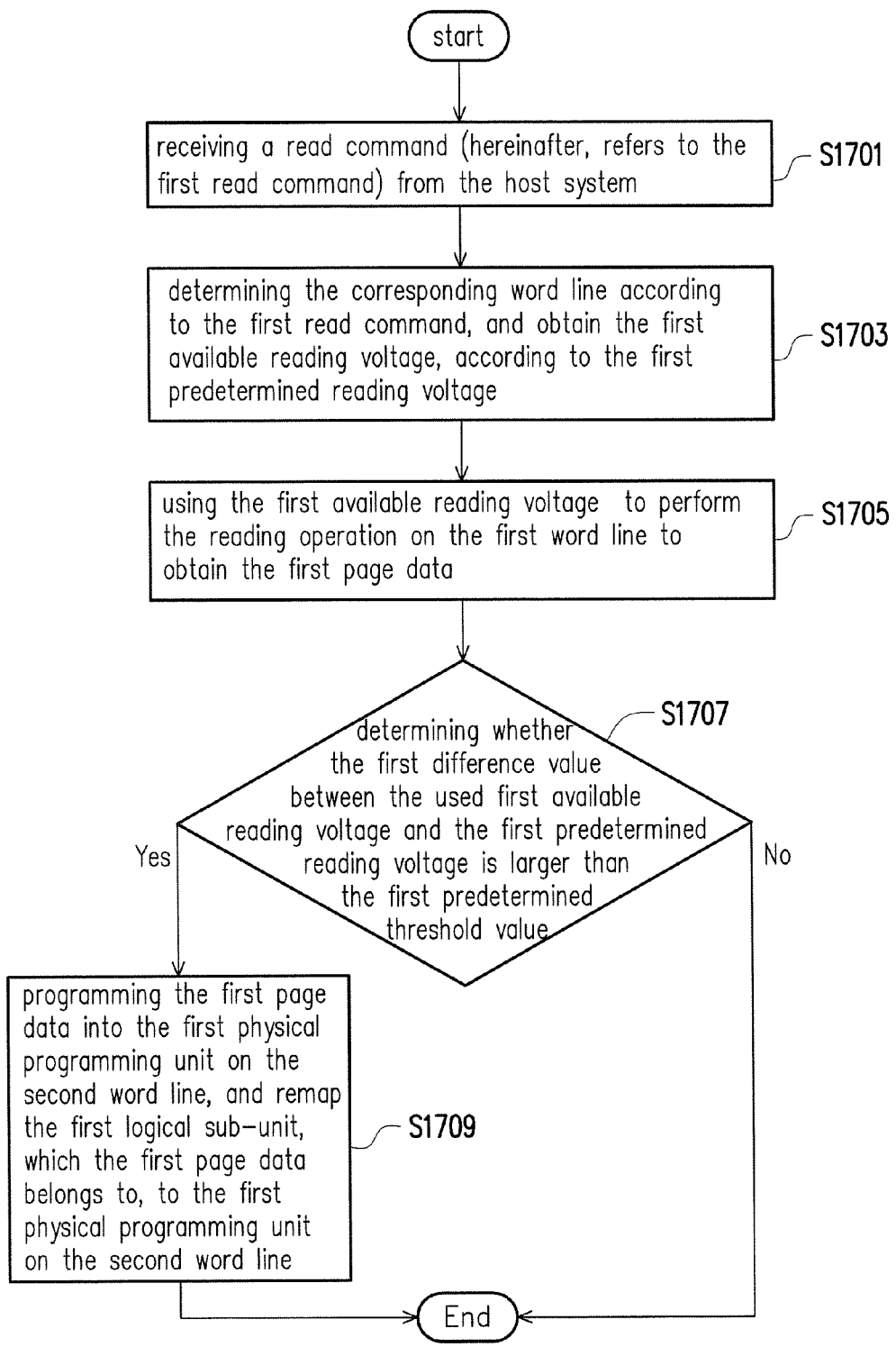
FIG. 17 is a flow chart illustrating data storing method according to an exemplary embodiment.

FIG. 17 is a flow chart illustrating data storing method according to an exemplary embodiment, wherein it takes a LSB of the memory cell for the example.

Referring to FIG. 17, in the step S1701, the memory control circuit unit 104 (or memory management circuit 202) receives a read command (hereinafter, refers to the first read command) from the host system.

And then, in step S1703, the memory control circuit unit 104 (or memory management circuit 202) may determine the corresponding word line according to the first read command, and obtain the first available reading voltage VVA, according to the first predetermined reading voltage VA.

And then, in the step S1705, the memory control circuit unit 104 (or memory management circuit 202) may use the first available reading voltage VVA to perform the reading operation on the first word line to obtain the first page data. Here, the memory control circuit unit 104 (or memory management circuit 202) may successfully correct the first page data which is read with the first available reading voltage VVA, and send the corrected data back to the host system, according to the first read command.

And the, in the step S1707, the memory control circuit unit 104 (or memory management circuit 202) may determine whether the first difference value DV between the used first available reading voltage VVA and the first predetermined reading voltage VA is larger than the first predetermined threshold value.

When the first difference value DV between the used first available reading voltage VVA and the first predetermined reading voltage VA is larger than the first predetermined threshold value, in step S1709, the memory control circuit unit 104 (or memory management circuit 202) may program the first page data into the first physical programming unit on the second word line, and remap the first logical sub-unit, which the first page data belongs to, to the first physical programming unit on the second word line. Namely, it performs the foregoing read-disturb protection operation.

When the first difference value DV between the used first available reading voltage VVA and the first predetermined reading voltage VA is not larger than the first predetermined threshold value, the memory control circuit unit 104 (or memory management circuit 202) may not perform the read-disturb protection operation to the first page data.

It should be understood, although it take the lower physical programming unit, which is constituted by the LSB of the memory cells of the MLC NAND flash memory, as an example in FIG. 17, however, the method may also be applied for reading the upper physical programming unit, which is constituted by the MSB of the memory cells of the MLC NAND flash memory, or the middle physical programming unit, which is constituted by the CSB of the memory cells of the TLC NAND flash memory. For example, in the case that reading the second page data stored in the upper physical programming unit of the MLC NAND flash memory, when the bit data which is obtained by applying the second predetermined reading voltage VB and the third predetermined reading voltage VC cannot be decoded to obtain the corresponding second page data, the memory control circuit unit 104 (or memory management circuit 202) may use the reading voltage adjustment value corresponding to the second predetermined reading voltage VB and the reading voltage adjustment value corresponding to the third predetermined reading voltage VC to respectively adjust the second predetermined reading voltage VB and the third predetermined reading voltage VC, and obtain the correctable second page data from the upper physical programming unit with the adjusted reading voltages. And then, the memory control circuit unit 104 (or memory management circuit 202) may determine whether the second available reading voltage VVB and the third available reading voltage VVC is shifted to the predefined range for the second predetermined reading voltage VB and the third predetermined reading voltage VC respectively to determine that if the memory control circuit unit 104 (or memory management circuit 202) shall perform the read-disturb protection operation to the second page data stored in the upper physical programming unit.

Accordingly, the data storing method, memory control circuit unit and the memory storage apparatus in the foregoing exemplary embodiments may perform a protection operation effectively to the data stored in the memory cells when determining that the critical voltage distribution of the memory cells is shifted over a predefined range. Moreover, the data storing method, memory control circuit unit and the memory storage apparatus in the foregoing exemplary embodiments may perform the read protection operation just when the critical voltage distribution is shifted too much, so that, it may decrease the number of times of performing the read protection operation and decrease the wear of the rewritable non-volatile memory module. Therefore, the lifespan of the rewritable non-volatile memory module may be extended effectively. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data storing method for a rewritable non-volatile memory module, wherein the rewritable non-volatile memory module has a plurality of memory cells, a plurality of word lines and a plurality of bit lines, each of the memory cells electrically connects with one of the word lines and one of the bit lines, each of the memory cells stores a plurality of bit data, and each of the bit data may, according to at least a voltage, be identified as a first state or a second state, the data storing method comprises:
    programming data into a plurality of memory cells connecting to a first word line among the word lines, wherein a first predetermined reading voltage is initially configured for the first word line;
    adjusting the first predetermined reading voltage to obtain a first available reading voltage for the first word line and applying the first available reading voltage to the first word line to read first page data, wherein the first page data may be corrected by an error checking and correcting circuit correctly; and
    when a first difference value between the first available reading voltage and the first predetermined reading voltage is larger than a first predetermined threshold value, programming the first page data into a plurality of memory cells connecting to a second word line among the word lines, wherein the second word line is different from the first word line.

2. The data storing method of claim 1, further comprising:
    remapping a first logical sub-unit to a first physical programming unit, wherein the first page data belongs to the first logical sub-unit,
    wherein the memory cells connecting to the second word line constitute a plurality of physical programming units and the first physical programming unit is one of the physical programming units.

3. The data storing method of claim 1, wherein the steps of adjusting the first predetermined reading voltage to obtain the first available reading voltage for the first word line and applying the first available reading voltage to the first word line to read the first page data comprising: performing a retry read operation according to a retry table.

4. The data storing method of claim 3, wherein the step of performing the retry read operation according to the retry table comprising:
    after performing the retry read operation at least one time, obtaining a first reading voltage adjustment value according to the retry table; and
    adjusting the first predetermined reading voltage according to the first reading voltage adjustment value to obtain the first available reading voltage.

5. The data storing method of claim 4, further comprising:
    determining whether the number of times of performing the retry read operation is larger than a first predetermined number and smaller than a second predetermined number; and
    if the number of times of performing the retry read operation is larger than the first predetermined number and smaller than the second predetermined number, identifying that the first difference value between the first available reading voltage and the first predetermined reading voltage is larger than the first predetermined threshold value.

6. The data storing method of claim 1, further comprising:
    applying a plurality of scanning voltages to the first word line to read a plurality of scanned bit data corresponding to each of the scanning voltages from the memory cells connecting to the first word line;
    respectively calculating a plurality of first state bit data increments of bit data identified as the first state among the scanned bit data corresponding to the scanning voltages;
    obtaining a critical voltage distribution of the memory cells of the first word line according to the first state bit data increments corresponding to the scanning voltages;
    searching a peak value in the critical voltage distribution and a valley value adjacent to the peak value;
    determining whether a ratio obtained by dividing the valley value with the peak value is larger than a first predetermined ratio; and
    if the ratio is larger than the first predetermined ratio, identifying that the first difference value between the first available reading voltage and the first predetermined reading voltage is larger than the first predetermined threshold value.

7. The data storing method of claim 1, further comprising:
    applying a plurality of scanning voltages to the first word line to read a plurality of scanned bit data respectively corresponding to the scanning voltages from the first word line;
    recording a plurality of error bit numbers respectively corresponding to the scanned bit data;
    determining whether an error bit number ratio obtaining by dividing a smallest error bit number with a largest error bit number among the error bit numbers is larger than a second predetermined ration; and
    when the error bit number ratio is larger than the second predetermined ratio, identifying that the first difference value between the first available reading voltage and the first predetermined reading voltage is larger than the first predetermined threshold value.

8. A memory control circuit unit for accessing a rewritable non-volatile memory module, the memory control circuit unit comprising:
    a host interface, coupled to a host system;

a memory interface, coupled to the rewritable non-volatile memory module, wherein the rewritable non-volatile memory module has a plurality of memory cells, a plurality of word lines and a plurality of bit lines, each of the memory cells electrically connects with one of the word lines and one of the bit lines, each of the memory cells stores a plurality of bit data, and each of the bit data may be identified as a first state or a second state; and a memory management circuit, coupled to the host interface and the memory interface, and is configured to give a first command sequence to the rewritable non-volatile memory module to program data into a plurality of memory cells connecting to a first word line among the word lines, wherein a first predetermined reading voltage is initially configured for the first word line, wherein the memory management circuit is further configured to adjust the first predetermined reading voltage to obtain a first available reading voltage for the first word line and give a second command sequence to the rewritable non-volatile memory module to apply the first available reading voltage to the first word line to read first page data, wherein the first page data may be corrected by an error checking and correcting circuit correctly, wherein when a first difference value between the first available reading voltage and the first predetermined reading voltage is larger than a first predetermined threshold value, the memory management circuit is further configured to issue a third command sequence to the rewritable non-volatile memory module to program the first page data into a plurality of memory cells connecting to a second word line among the word lines, wherein the second word line is different from the first word line.

9. The memory control circuit unit of claim 8, wherein the memory management circuit is further configured to remap a first logical sub-unit to the first page data to a first physical programming unit, wherein the first data belongs to the first logical sub-unit, wherein the memory cells connecting to the second word line constitute a plurality of physical programming units and the first physical programming unit is one of the physical programming units.

10. The memory control circuit unit of claim 8, wherein the memory management circuit is further configured to, give a fourth command sequence to the rewritable non-volatile memory module to perform a retry read operation according to a retry table to read data from the memory cells connecting to the first word line.

11. The memory control circuit unit of claim 10, wherein the memory management circuit, after performing the retry read operation at least one time, obtains a first reading voltage adjustment value according to the retry table, wherein the memory management circuit, adjusts the first predetermined reading voltage according to the first reading voltage adjustment value to obtain the first available reading voltage.

12. The memory control circuit unit of claim 11, wherein the memory management circuit determines whether the number of times of performing the retry read operation is larger than a first predetermined number and smaller than a second predetermined number, wherein if the number of times of performing the retry read operation is larger than the first predetermined number and smaller than the second predetermined number, the memory management circuit identifies that the first difference value between the first available reading voltage and the first predetermined reading voltage is larger than the first predetermined threshold value.

13. The memory control circuit unit of claim 8, wherein the memory management circuit applies a plurality of scanning voltages to the first word line to read a plurality of scanned bit data corresponding to each of the scanning voltages from the memory cells connecting to the first word line, wherein the memory management circuit respectively calculates a plurality of first state bit data increments from the bit data identified as the first state among the scanned bit data corresponding to the scanning voltages, wherein the memory management circuit, obtains a critical voltage distribution of the memory cells of the first word line according to the first state bit data increments corresponding to the scanning voltages, wherein the memory management circuit searches a peak value in the critical voltage distribution and a valley value adjacent to the peak value, wherein the memory management circuit determines whether a ratio obtained by dividing the valley value with the peak value is larger than a first predetermined ratio, wherein if the ratio is larger than the first predetermined ratio, the memory management circuit identifies that the first difference value between the first available reading voltage and the first predetermined reading voltage is larger than the first predetermined threshold value.

14. The memory control circuit unit of claim 8, wherein the memory management circuit applies a plurality of scanning voltages to the first word line to read a plurality of scanned bit data respectively corresponding to the scanning voltages from the first word line, wherein the memory management circuit records a plurality of error bit numbers respectively corresponding to the scanned bit data, wherein the memory management circuit determines whether an error bit number ratio obtained by dividing a smallest error bit number with a largest error bit number among the error bit numbers is larger than a second predetermined ratio, wherein if the ratio is larger than the second predetermined ratio, the memory management circuit identifies that the first difference value between the first available reading voltage and the first predetermined reading voltage is larger than the first predetermined threshold value.

15. A memory storage device, comprising:

a connection interface unit, coupled to a host system;

a rewritable non-volatile memory module, wherein the rewritable non-volatile memory module has a plurality of memory cells, a plurality of word lines and a plurality of bit lines, each of the memory cells electrically connects with one of the word lines and one of the bit lines, each of the memory cells stores a plurality of bit data, and each of the bit data may be identified as a first state or a second state; and a memory control circuit unit, coupled to the connection interface unit and the rewritable non-volatile memory module, and is configured to program data into a plurality of memory cells connecting to a first word line among the word lines, wherein a first predetermined reading voltage is initially configured for the first word line, wherein the memory control circuit unit is further configured to adjust the first predetermined reading voltage to obtain a first available reading voltage for the first word line and apply the first available reading voltage to the first word line to read first page data, wherein the first page data may be corrected by an error checking and correcting circuit correctly, wherein when a first difference value between the first available reading voltage and the first predetermined reading voltage is larger than a first predetermined threshold value, the memory control circuit unit is further configured to program the first page data into a plurality of memory cells connecting to a second word line among the word lines, wherein the second word line is different from the first word line.

16. The memory storage apparatus of claim 15, wherein the memory control circuit unit is further configured to remap a first logical sub-unit to a first physical programming unit, wherein the first page data belongs to the first logical sub-unit, wherein the memory cells connecting the second word line constitute a plurality of physical programming units and the first physical programming unit is one of the physical programming units.

17. The memory storage apparatus of claim 15, wherein the memory control circuit unit is further configured to perform a retry read operation according to a retry table to read data from the memory cells connecting to the first word line.

18. The memory storage apparatus of claim 17, wherein the memory control circuit unit, after performing the retry read operation at least one time, obtains a first reading voltage adjustment value according to the retry table, wherein the memory control circuit unit, adjusts the first predetermined reading voltage according to the first reading voltage adjustment value to obtain the first available reading voltage.

19. The memory storage apparatus of claim 18, wherein the memory control circuit unit determines whether the number of times of performing the retry read operation is larger than a first predetermined number and smaller than a second predetermined number, wherein if the number of times of performing the retry read operation is larger than the first predetermined number and smaller than the second predetermined number, the memory control circuit unit identifies that the first difference value between the first available reading voltage and the first predetermined reading voltage is larger than the first predetermined threshold value.

20. The memory storage apparatus of claim 15, wherein the memory control circuit unit applies a plurality of scanning voltages to the first word line to read a plurality of scanned bit data corresponding to each of the scanning voltages from the memory cells connecting to the first word line, wherein the memory control circuit unit respectively calculates a plurality of first state bit data increments from the bit data identified as the first state among the scanned bit data corresponding to the scanning voltages, wherein the memory control circuit unit obtains a critical voltage distribution of the memory cells of the first word line according to the first state bit data increments corresponding to the scanning voltages, wherein the memory control circuit unit searches a peak value in the critical voltage distribution and a valley value adjacent to the peak value, wherein the memory control circuit unit determines whether a ratio obtained by dividing the valley value with the peak value is larger than a first predetermined ratio, wherein if the ratio is larger than the first predetermined ratio, the memory control circuit unit identifies that the first difference value between the first available reading voltage and the first predetermined reading voltage is larger than the first predetermined threshold value.

21. The memory storage apparatus of claim 15, wherein the memory control circuit unit applies a plurality of scanning voltages to the first word line to read a plurality of scanned bit data corresponding to the scanning voltages from the first word line, wherein the memory control circuit unit records a plurality of error bit numbers respectively corresponding to the scanned bit data, wherein the memory control circuit unit determines whether an error bit number ratio obtained by dividing a smallest error bit number with a largest error bit number among the error bit numbers is larger than a second predetermined ratio, wherein when the ratio is larger than the second predetermined ratio, the memory control circuit unit identifies that the first difference value between the first available reading voltage and the first predetermined reading voltage is larger than the first predetermined threshold value.

* * * * *